US006737283B2

(12) United States Patent
Morgan (10) Patent No.: US 6,737,283 B2
(45) Date of Patent: May 18, 2004

(54) METHOD TO ISOLATE DEVICE LAYER EDGES THROUGH MECHANICAL SPACING

(75) Inventor: Paul A. Morgan, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/230,191

(22) Filed: Aug. 29, 2002

(65) Prior Publication Data

US 2004/0041181 A1 Mar. 4, 2004

(51) Int. Cl.[7] .............................................. H01L 21/00
(52) U.S. Cl. ........................ 438/3; 438/3; 438/238; 438/381; 257/295; 257/659
(58) Field of Search ............................ 438/3, 238, 381; 257/295, 659

(56) References Cited

U.S. PATENT DOCUMENTS

| 4,357,369 A | 11/1982 | Kilichowski et al. |
| 4,396,704 A | 8/1983 | Taylor |
| 4,426,247 A | 1/1984 | Tamamura et al. |
| 4,433,044 A | 2/1984 | Meyer et al. |
| 4,523,372 A | 6/1985 | Balda et al. |
| 4,552,833 A | 11/1985 | Ito et al. |
| 5,079,131 A | 1/1992 | Thackeray et al. |
| 5,487,967 A | 1/1996 | Hutton et al. |
| 5,940,319 A | 8/1999 | Durlam et al. |
| 6,024,885 A | 2/2000 | Pendharkar et al. |
| 6,204,524 B1 | 3/2001 | Rhodes |
| 6,348,365 B1 | 2/2002 | Moore et al. |
| 6,358,756 B1 * | 3/2002 | Sandhu et al. ............... 438/3 |
| 6,555,858 B1 * | 4/2003 | Jones et al. ............... 257/295 |

* cited by examiner

Primary Examiner—David Nelms
Assistant Examiner—Mai-Huong Tran
(74) Attorney, Agent, or Firm—Dickstein Shapiro Morin & Oshinsky LLP (57) ABSTRACT

An MRAM cell and a method of forming the an MRAM cell minimizes the occurrence of electrical shorts along the side walls of the stacked cell structure during fabrication. Specifically, a first conductor is provided in a trench in an insulating layer, and then an upper surface of the insulating layer and the first conductor are planarized. Next, as the layers forming the stacks of the MRAM cells are deposited on the planarized insulating layer and first conductor, the critical layers are physically separated from adjacent layers at regions surrounding an interior region of the stacked layers. The stacked layers at the interior region form an MRAM cell, while the separated edges prevent conductive layers from being formed along the sidewalls of the MRAM cell due to sputtering during the etching process(es) performed to define the cell.

27 Claims, 11 Drawing Sheets

| COPPER | 28 |
|---|---|
| TANTALUM ~100A | 27 |
| NICKEL/IRON ~40A | 21 |
| ALUMINUM OXIDE ~15A | 25 |
| NICKEL/IRON ~40A | 20c |
| IRIDIUM/MANGANESE ~60A | 20b |
| NICKEL/IRON ~40A | 20a |
| TANTALUM | 24b |
| COPPER | 19 |
| TANTALUM | 24a |

METHOD TO ISOLATE DEVICE LAYER EDGES THROUGH MECHANICAL SPACING

FIELD OF THE INVENTION

The present invention relates to magnetic random access memory (MRAM) cells and a method for fabricating the same.

BACKGROUND OF THE INVENTION

Magnetic random access memories (MRAMs) employ a plurality of memory cells each formed as a stack of spaced thin magnetic multilayer films. When in use, an MRAM cell stores information as a digital bit based on the relative magnetic orientations of the magnetic layers in the stack. Each MRAM cell has two stable magnetic film orientations, one which produces a high resistance across the cell representing) e.g., a logic state 0, and another which produces a lower resistance across the cell representing, e.g., a logic state 1, or vice versa.

Figure 1:
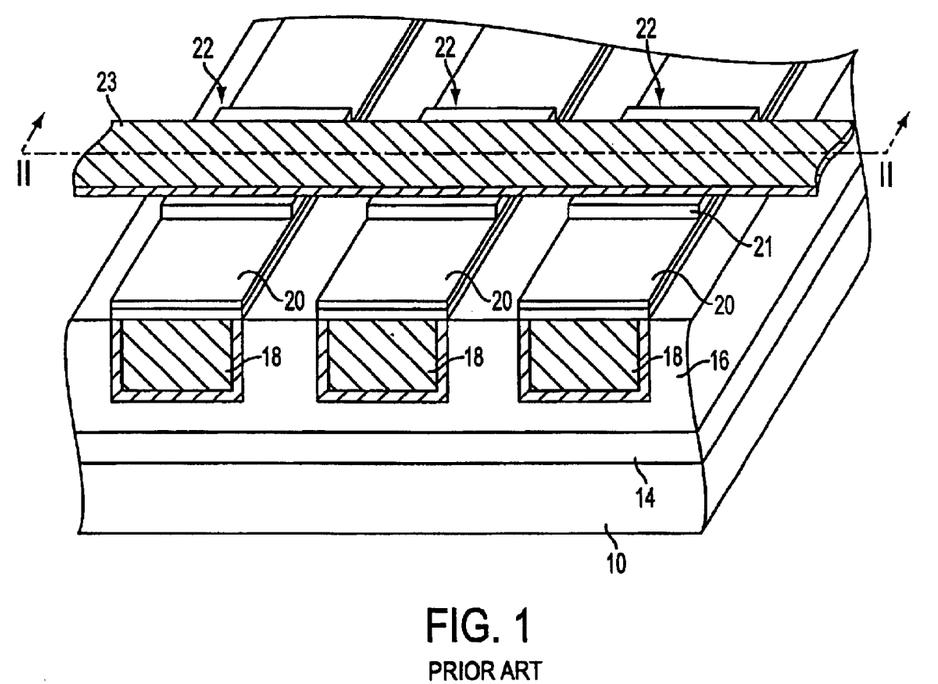
FIG. 1 is a schematic three-dimensional view of a portion of a conventional MRAM structure.

A typical MRAM structure includes an array having a number of bit or digit (column) lines intersected by a number of word (row) lines. An MRAM cell is formed between a digit line and a row line at each intersection. FIG. 1 shows an exemplary conventional MRAM structure including a plurality of MRAM cells 22 formed at the intersections of a number of bit or digit lines 18 and word line 23. The digit lines 18 are typically formed of copper (Cu) in an insulating layer 16. Both the digit lines 18 and the insulating layer are formed over underlayers 14 of an integrated circuit (IC) substrate 10, wherein, the underlayers 14 may include, for example, portions of integrated circuitry, such as CMOS circuitry.

For each row of MRAM cells in the array, all of the MRAM cells in the row are coupled to a word line that intersects each of the bit lines. In the example shown in FIG. 1, the three MRAM cells 22 seen in the drawing are coupled to word line 23 which intersects the corresponding bit lines 18. While word line 23 and bit lines 18 are illustrated as seen in FIG. 1, the positions and functions of word line 23 and bit lines 18 may be interchanged.

The basic memory MRAM cell has a pinned magnetic layer having a fixed magnetic orientation, a free (sense) magnetic element having an orientation which is changeable between two orientations, and a nonmagnetic layer between them. In magnetic tunnel junction (MTJ) MRAM devices, the nonmagnetic layer is typically known as a tunnel junction layer. The orientation of the free (sense) element is set in accordance with the direction of an applied magnetic field for writing logical data to be stored by the cell.

Each of the two orientations of the sense element in the MRAM cells is assigned a bit value of either "0" or "1." Data is stored in an MRAM cell by applying a magnetic field produced by transmitting signals in the appropriate directions through the respective digit line 18 and word line 23 which intersect at the desired cell into which data is to be written. The stored data is retained in the MRAM cell until it is overwritten by another Write operation on the same cell.

Data stored in the MRAM cells is read by measuring the resistance through each cell in a vertical direction extending through the pinned magnetic element, the tunnel junction layer and the sense magnetic element. The resistance of an MRAM cell is measured by transmitting a current through the tunnel junction layer from one of the magnetic elements to the other. A reference current level is set to a value in between that obtained from an MRAM cell in an antiparallel orientation and that obtained from an MRAM cell in a parallel orientation. When a read current from a selected MRAM cell is greater than the reference current, the value stored in the MRAM cell is interpreted to be a "1," whereas when the read current is less than the reference current, the stored value is interpreted to be a "0."

Figure 2:
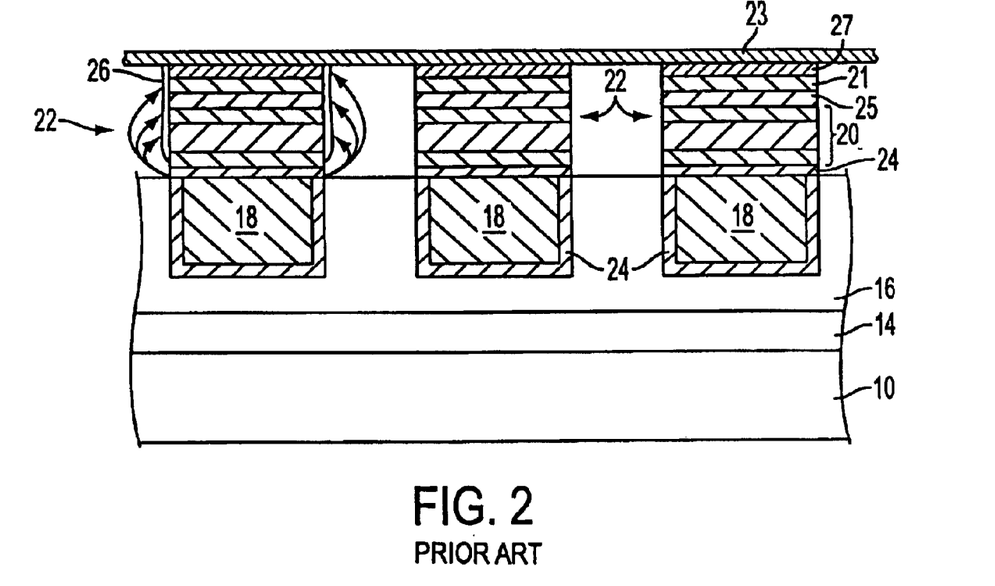
FIG. 2 is a side sectional view of the MRAM structure of FIG. 1 through the plane indicated at II—II, for showing a side conductive layer formed thereon during fabrication.

FIG. 2 illustrates a side sectional view of the MRAM structure seen in FIG. 1, wherein a pinned magnetic element 20 of a respective MRAM cell 22 is provided over each digit line 18. A tunnel junction layer 25 is formed over the pinned magnetic element 20, and a free (sense) magnetic element 21 is provided over the tunnel junction layer. A word line 23 is provided over the sense magnetic element 21 of all the MRAM cells 22 in a row. Typically, pinned magnetic element 20 and sense magnetic element 21 are each formed of ferromagnetic materials, while tunnel junction layer 25 is made of a nonmagnetic, electrically conductive material such as, for example, $Al_2O_3$. Together, each stack composed of the pinned magnetic element 20, the tunnel junction layer 25 and the sense magnetic element 21 forms an MRAM cell 22.

Additionally, a bottom conductive barrier layer 24 composed of, for example, tantalum (Ta), is formed at the base of the pinned magnetic element 20 to improve adhesion of the pinned layer to the material forming the respective bit line 18. Similarly, the barrier layer 24 also lines the trenches in insulating layer 16 in which the bit lines 18 are formed.

Figure 3:
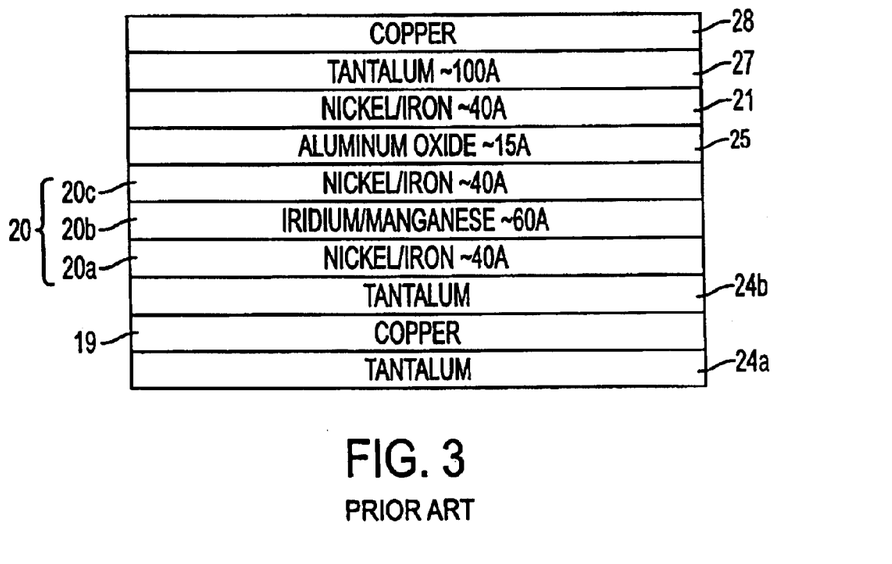
FIG. 3 is a schematic illustration of the layers in a typical MRAM stack.

A schematic view of the layers of a typical MRAM stack is shown in FIG. 3 and may include a first barrier layer 24a composed of Ta to enhance bonding between the adjacent layers; a first conductive layer 19 made of copper (Cu) (for forming the bit line 18); a second Ta barrier layer 24b; a pinned magnetic element 20 formed of a magnetic seed layer 20a made of Nickel/Iron (NiFe), an antiferromagnetic layer 20b made of Iridium/Manganese (Ir/Mn), and an NiFe magnetic layer 20c having its magnetic orientation pinned by the antiferromagnetic layer 20b; a nonmagnetic, electrically conductive tunnel junction layer 25 made of Aluminum Oxide ($Al_2O_3$); a sense magnetic element formed of an NiFe magnetic layer 21; a third Ta barrier layer 27; and a second conductive layer 28 (for forming the word line 23).

Fabrication of such stacks forming the complete MRAM cells requires deposition of the thin materials layer by layer, according to a predefined order, in conjunction with an etching process to define the individual cells. During a dry etching step typically performed to define the cells 22 such as ion milling, for example, the conductive layers may sputter back onto the sidewalls of the stacks, forming a side conductive layer 26 and creating an undesirable electrical short between the pinned magnetic element 20 and sense magnetic element 21. Thus, during a read operation, the current may flow through the side conductive layer 26 rather than flow through the tunnel junction layer 25, causing improper resistance sensing. Hence, what is needed is a method of fabricating an MRAM cell which will not create a short as described above.

BRIEF SUMMARY OF THE INVENTION

The present invention provides an MRAM cell and a method of forming the same which minimizes the occurrence of electrical shorts during fabrication. According to the present invention, a first conductor is provided in a trench in an insulating layer, and then an upper surface of the insulating layer and the first conductor are planarized. Next, as the layers forming the stacks of the MRAM cells are deposited on the planarized insulating layer and first conductor, the critical layers are physically separated from adjacent layers at regions surrounding an interior region of the stacked layers. The stacked layers at the interior region form an MRAM cell, while the separated edges prevent a conductive layer from being formed along the sidewalls of the MRAM cell due to sputtering during an etching process performed to define the cell.

These and other features and advantages of the present invention will become more apparent from the following detailed description of the invention provided below with reference to the accompanying drawings.

DETAILED DESCRIPTION OF THE INVENTION

In the following detailed description, reference is made to an exemplary embodiment of the invention. The embodiment is described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has an exposed semiconductor surface. Such structure must be understood to include silicon, silicon-on insulator (SOI), silicon-on sapphire (SOS), doped and undoped semiconductors, epitaxial layers of silicon supported by a base semiconductor foundation, silicon-germanium, germanium, gallium arsenide, and other semiconductor structures. Also, when reference is made to a substrate in the following description, previous process steps typical in the art and not specifically discussed herein may have been utilized to form regions or junctions in or on the base semiconductor or foundation.

Figure 4:
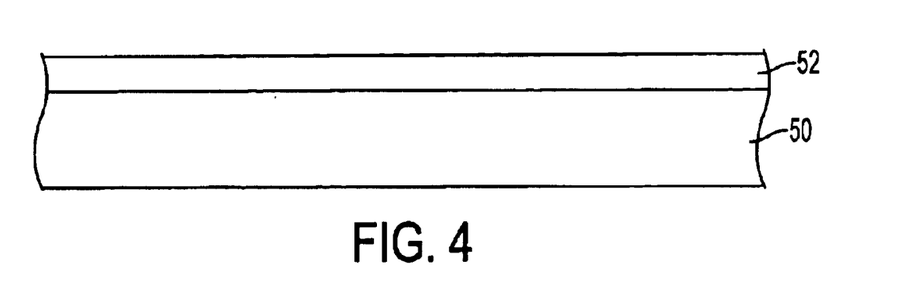
FIG. 4 illustrates a partial cross-sectional view of a semiconductor topography, at an intermediate stage of the processing, wherein a MRAM structure will be constructed in accordance with the present invention.

FIG. 4 depicts a portion of a semiconductor substrate 50 on which underlying layer 52 has been already formed according to methods which are well-known in the art. The underlying layer 52 may include, for example, circuit layers having CMOS access and logic transistors fabricated within it. The CMOS access transistors (not shown) can be fabricated over the substrate 50 and within underlying layer 52 in the regions around and outside the periphery of the MRAM array to control the functioning (reading and writing) of the MRAM devices. Other CMOS transistors, such as logic or decoder transistors, can be fabricated in this same underlying layer 52 but directly under the MRAM array. Other spatial arrangements of the access and logic transistors within underlying layer 52 may also be used. The location of transistors within underlying layer 52 conserves valuable surface space on the wafer. The substrate, including layers 50 and 52, is a planarized structure over which the MRAM device is to be fabricated in accordance with this invention.

Figure 5:
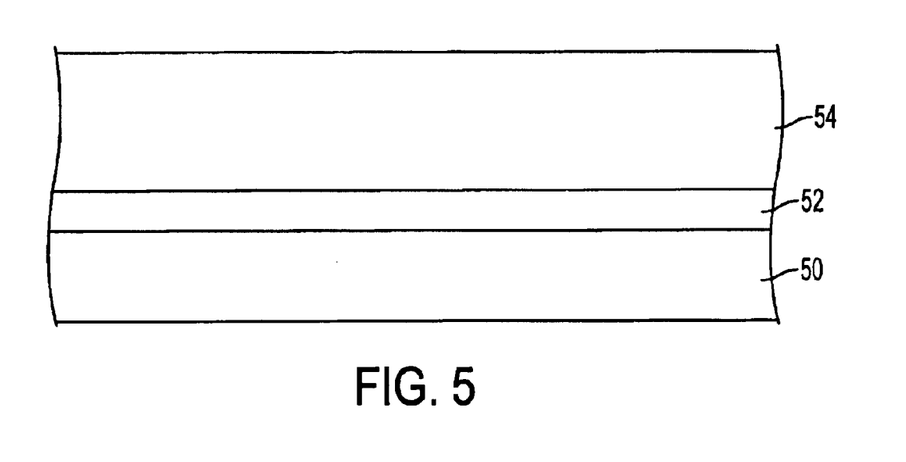
FIG. 5 illustrates a partial cross-sectional view of the MRAM structure at a stage of processing subsequent to that shown in FIG. 4.

Referring now to FIG. 5, an insulating (or dielectric) layer 54 is formed over the substrate 50 and the underlying layer 52. In an exemplary embodiment of the invention, the insulating layer 54 is blanket deposited on the underlying layer 52 by spin coating to a thickness of about 1,000 Angstroms to about 10,000 Angstroms. Alternatively, formation of the insulating layer 54 may be accomplished by any other convenient means known in the art, such as chemical vapor deposition (CVD), plasma enhanced CVD (PECVD), vacuum evaporation, or oxidation of a deposited layer. The insulating layer 54 may be formed of a conventional insulator, for example, BPSG, a thermal oxide of silicon, such as SiO or $SiO_2$, or a nitride such as $Si_3N_4$. Alternatively, a high temperature polymer, such as a polyimide, or a low dielectric constant inorganic material may also be employed.

Figure 6:
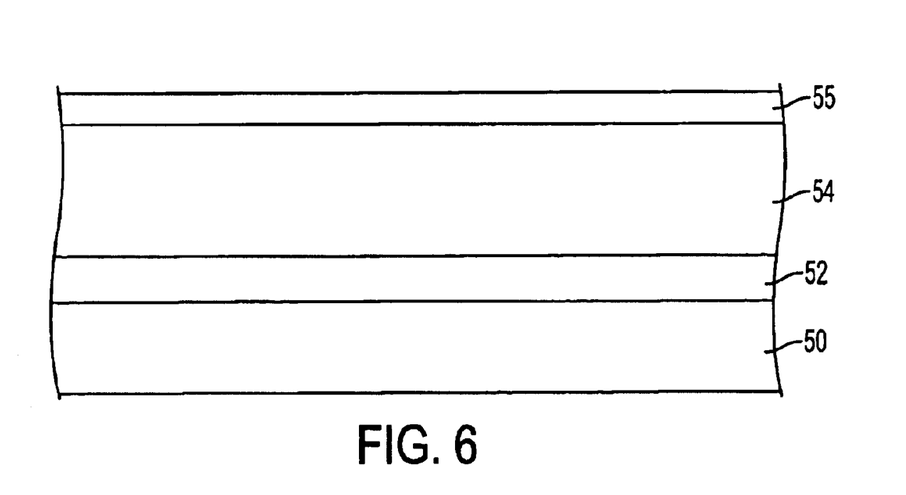
FIG. 6 illustrates a partial cross-sectional view of the MRAM structure at a stage of processing subsequent to that shown in FIG. 5.

Next, as illustrated in FIG. 6, a photoresist layer 55 is formed over the insulating layer 54. The photoresist layer 55 is exposed through a mask 56 (FIG. 7) with high-intensity UV light. The mask 56 includes any suitable pattern of opaque and clear regions that define the desired pattern to be formed in the insulating layer 54. In the example shown in FIG. 7, the photoresist layer 55 is a positive resist and mask 56 is a clear field mask so that portions 55a of the photoresist layer are exposed through portions 56a of the mask 56 wherever portions of the insulating layer 54 need to be removed. Alternatively, a dark field mask, in which portions 56a of the mask are opaque and portions 56b are clear, may be used in conjunction with a negative resist in which exposed portions 55b of the resist arc hardened upon exposure and unexposed portions 55a are removed.

Figure 7:
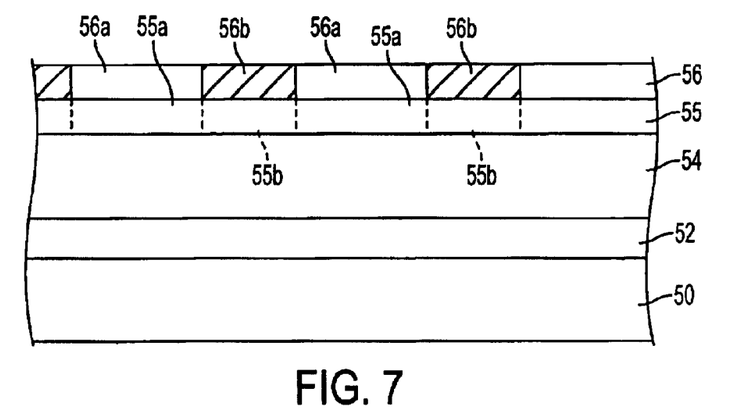
FIG. 7 illustrates a partial cross-sectional view of the MRAM structure at a stage of processing subsequent to that shown in FIG. 6.
Figure 8:
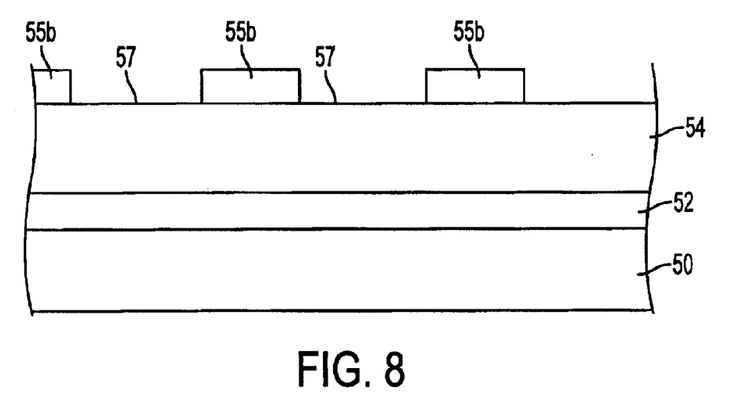
FIG. 8 illustrates a partial cross-sectional view of the MRAM structure at a stage of processing subsequent to that shown in FIG. 7.

Although FIG. 7 schematically illustrates mask 56 positioned directly on the photoresist layer 55, those skilled in the art will appreciate that mask 56 is typically spaced from the photoresist layer 55 and light passing through mask 56 is focussed onto the photoresist layer 55. After exposure and development of the exposed portions 55a shown in FIG. 7, portions 55b of the unexposed and undeveloped photoresist are left over the insulating layer 54, as shown in FIG. 8. In this manner, openings 57 are formed in the photoresist layer 55.

Figure 9:
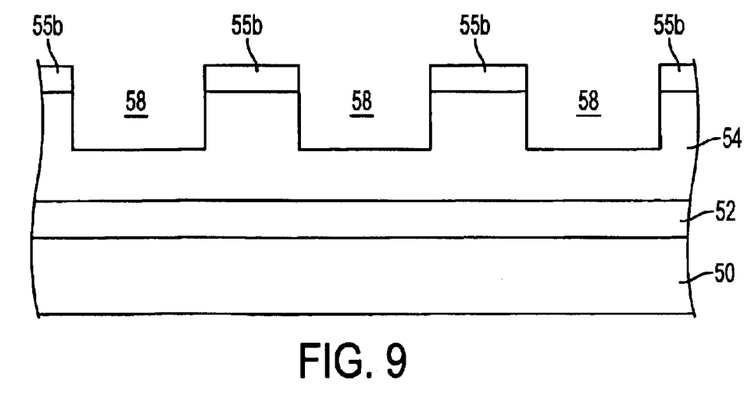
FIG. 9 illustrates a partial cross-sectional view of the MRAM structure at a stage of processing subsequent to that shown in FIG. 8.
Figure 10:
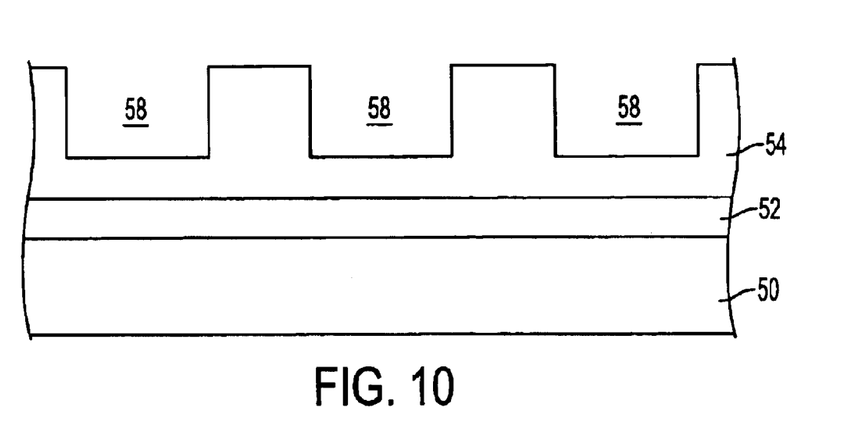
FIG. 10 illustrates a partial cross-sectional view of the MRAM structure at a stage of processing subsequent to that shown in FIG. 9.

An etch operation is performed next to obtain trenches 58 in the insulating layer 54, as illustrated in FIG. 9. The trenches 58 are etched to a depth of about 500 Angstroms to about 2,000 Angstroms, more preferably of about 1,000 Angstroms. Insulating layer 54 may be etched by any method readily known in the art, including immersion or spray-type wet etching, and plasma etching, ion milling, reactive ion-type dry etching, etc. Subsequent to the formation of the trenches 58, the remaining portions 55b of the positive photoresist layer 55 are then removed by chemicals, such as hot acetone or methylethylketone, or by flooding the substrate 50 with UV irradiation to degrade the remaining portions 55b to obtain the structure shown in FIG. 10.

Figure 11:
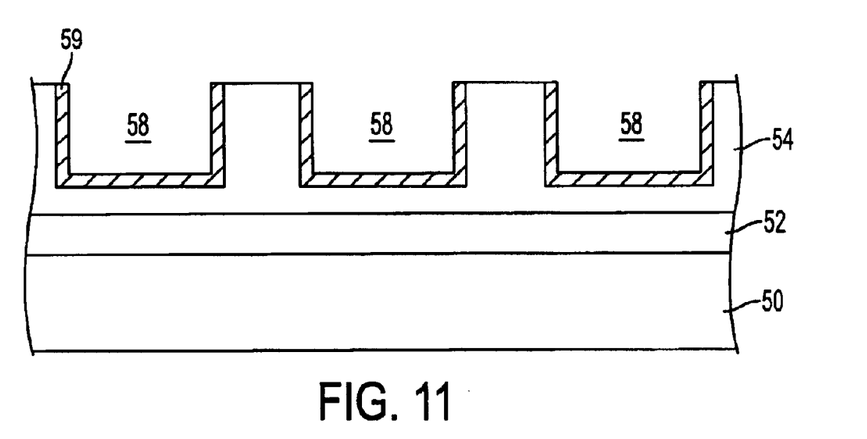
FIG. 11 illustrates a partial cross-sectional view of the MRAM structure at a stage of processing subsequent to that shown in FIG. 10.

After forming the trenches 58, a thin barrier layer 59 is formed in the trenches 58 and over the insulating layer 54, and is then chemically mechanically polished to remove barrier layer material from the top portions of the insulating layer 54, as shown in FIG. 11. The barrier layer 59 may comprise one or more bonding materials such as tantalum (Ta), titanium (Ti), titanium-tungsten (TiW), titanium nitride (TiN) or chromium (Cr), among others. The barrier layer 59 forms a strong mechanical and chemical bond between the conductive material which will be formed later and the insulating layer 54 to help prevent migration of the conductive material into the insulating layer. The barrier layer 59 may be formed by low pressure chemical vapor deposition (LPCVD) or sputtering to a thickness of about 5 nm to about 10 nm.

Figure 12:
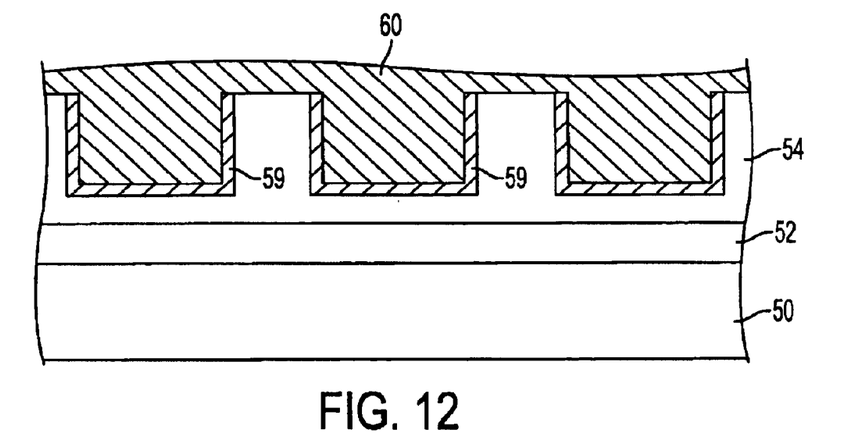
FIG. 12 illustrates a partial cross-sectional view of the MRAM structure at a stage of processing subsequent to that shown in FIG. 11.

Next, as illustrated in FIG. 12, a conductive material layer 60 is formed over the barrier layer 59 and the insulating layer 54 to fill in the trenches 58. In a preferred embodiment, the conductive material comprises copper (Cu). However, other conductive materials such as aluminum (Al), tungsten (W) or gold (Au), among others, may also be used. Further, metal alloys may be used as the conductive metal, depending on the desired characteristics of the integrated circuit device to he operatively associated with the MRAM device of the present invention.

Figure 13:
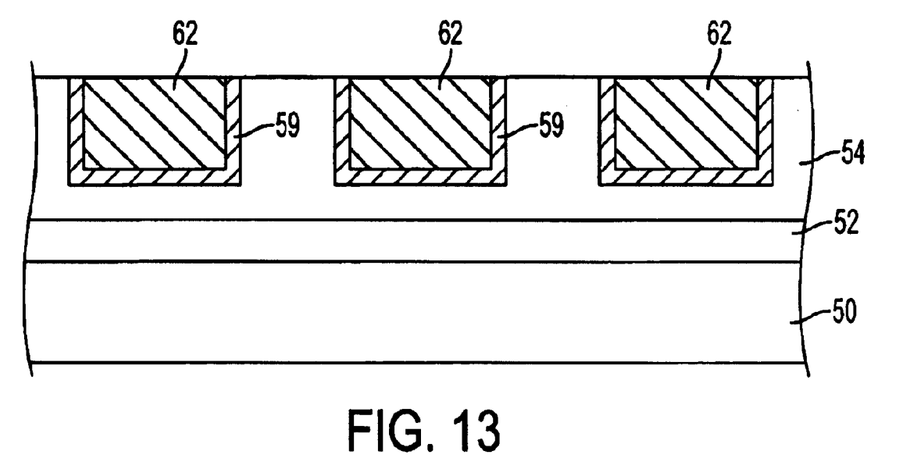
FIG. 13 illustrates a partial cross-sectional view of the MRAM structure at a stage of processing subsequent to that shown in FIG. 12.

The conductive material layer 60 is formed over the barrier layer 59 by any known technique, such as electroplating, vacuum evaporation, sputtering, chemical vapor deposition (CVD), or plasma enhanced CVD (PECVD), for example, and then excess material is removed. The conductive material is used to form signal lines 62 (FIG. 13) connecting the MRAM cells to the periphery CMOS controlling transistors for regulating the reading and writing of the memory cells. In exemplary embodiment of the present invention, the excess conductive material layer 60 is removed by means of chemical mechanical polishing (CMP). The top surfaces of the barrier layer 59 and the signal lines 62 are generally flat and uniform across the entire surface of the substrate, as shown in FIG. 13. Each signal line 62 will form the bit or digit line of an MRAM structure.

Figure 14:
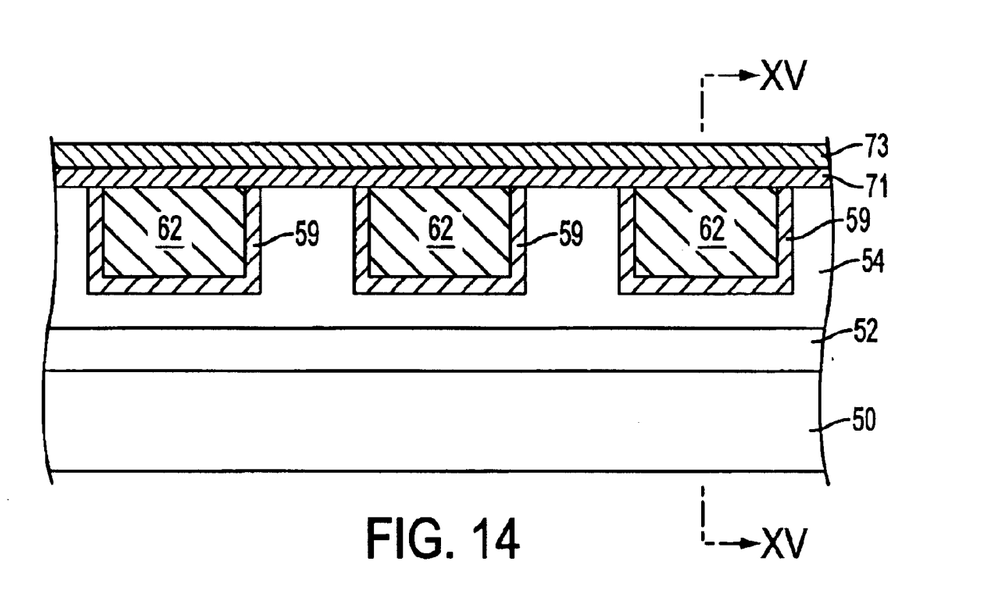
FIG. 14 illustrates a partial cross-sectional view of the MRAM structure at a stage of processing subsequent to that shown in FIG. 13.

As illustrated in FIG. 14, a first tantalum (Ta) layer 71 and a first nickel-iron (NiFe) layer 73 are blanket deposited over the insulating layer 54 and the signal lines 62. The Ta layer 71 is deposited to a thickness of about 20–400 Angstroms, and more preferably to a thickness of about 50 Angstroms. The NiFe layer 73 serves as a seed layer for the pinned magnetic element of the MRAM device, and is deposited to a thickness of about 10–100 Angstroms, more preferably to a thickness of about 40 Angstroms. Deposition of the layers 71 and 73 may be accomplished by magnetron sputtering, for example. Alternatively, other conventional deposition methods may be used, such as vacuum evaporation, CVD, PECVD, other sputtering processes, etc.

As the invention is further described below with reference to FIGS. 15–21, it is noted that FIGS. 15–21 schematically show all the layers previously discussed above, including barrier layer 59 and signal line 62, as flat layers of uniform thickness, for simplicity of further explanation; however, it should be understood that those layers are preferably formed according to the structural characteristics described above with reference to FIGS. 4–14. Additionally, FIGS. 15–21 represent cross-sectional views through an MRAM cell which are rotated 90° with respect to the views shown in FIGS. 2–14, as viewed through the plane XV—XV indicated in FIG. 14.

Figure 15:
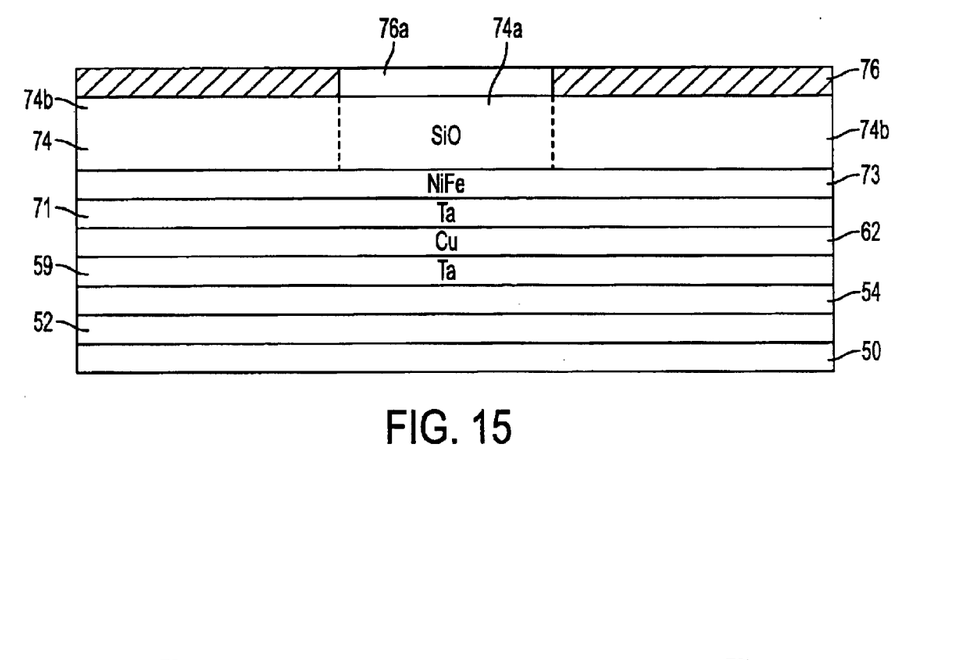
FIG. 15 illustrates a partial cross-sectional view of the MRAM structure as viewed through the plane XV—XV indicated in FIG. 14, and showing a stage of processing subsequent to that shown in FIG. 14.
Figure 16:
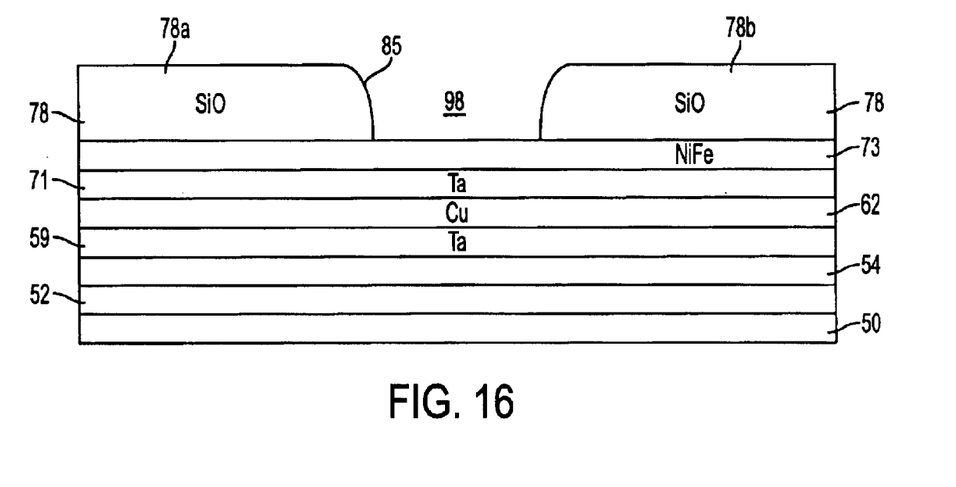
FIG. 16 illustrates a partial cross-sectional view of the MRAM structure at a stage of processing subsequent to that shown in FIG. 15.

Referring now to FIG. 15, after deposition of the NiFe layer 73, a first insulating spacer layer 78 is formed thereon, by providing a positive photoresist layer 74 made of a silicon-containing material on the NiFe layer 73, and then patterning the photoresist by covering it with a dark field mask 76, so that the portion 74a of the photoresist layer 74 desired to be removed is exposed through the clear portion 76a of mask 76. An example of a positive silicon-containing photoresist usable in this regard is the Shipley XP-2762A photoresist, available from Shipley Company, L.L.C. in Marlborough, Mass. After exposure, the photoresist layer 74 is then developed to remove portion 74a, and the remaining resist portions 74b are then converted to a stable SiO film by heating the portions 74b at a relatively low temperature (e.g., about 100° C.) in an oxygen-rich plasma environment. This heating process removes the volatile components of the photoresist film and produces a reaction between the silicon in the film and the plasma oxygen to thereby form the SiO spacer layer 78, as shown in FIG. 16. Preferably, spacer layer 78 has a thickness of 700–1000 Angstroms, although thicker or thinner films are also within the scope of the invention, as long as the film provides sufficient separation between the NiFe layer 73 and the layer subsequently deposited thereon, as described below, to prevent electrical current from shorting between the layers along the side walls thereof.

Optionally, upper edges 85 of spacer layer 78 may be rounded by spacing the mask 76 slightly from the photoresist layer 74 during exposure so that the peripheral areas of photoresist layer 74 surrounding the exposed portion 74a are also exposed due to leakage around the peripheral edge of clear portion 76a of mask 76. Alternatively, the upper edges 85 may be rounded by chemical etching or mechanical means either before or after conversion to the SiO film. After formation of spacer layer 78, the remaining layers of the MRAM cell are deposited as described below to form a stack of thin layers in the recessed region 98 in the spacer layer 78.

Figure 17:
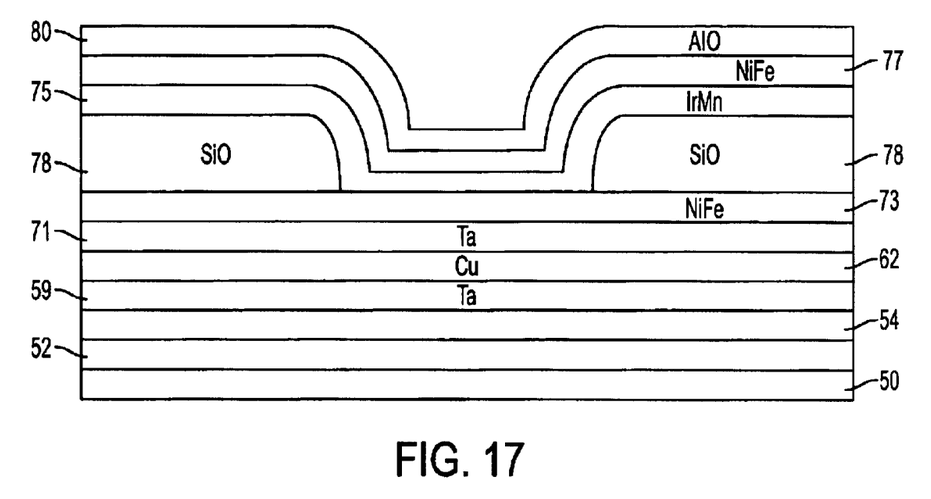
FIG. 17 illustrates a partial cross-sectional view of the MRAM structure at a stage of processing subsequent to that shown in FIG. 16.

An iridium-manganese (IrMn) layer 75, a second nickel-iron (NiFe) layer 77, and a nonmagnetic layer or tunnel junction layer 80 formed of, for example, aluminum oxide ($Al_2O_3$), are successively blanket deposited over the spacer layer 78 and first NiFe layer 73, as shown in FIG. 17. The positions of layers 75, 77 and 80 lie directly over layer 73 in the recessed region 98 shown in FIG. 16 between the two portions 78a and 78b of the first spacer layer 78 shown in the figure. Together, first NiFe layer 73, IrMn layer 75 and second NiFe layer 77 form the pinned magnetic element, which has a fixed magnetic field.

IrMn layer 75 serves as the pinning layer for fixing the magnetic orientation of the pinned magnetic layer of the MRAM cell, and NiFe layer 77 is the pinned magnetic layer, meaning that the magnetic orientation of the layer is fixed and will not shift during the reading and writing of the MRAM device. The NiFe layer is pinned because of its association with the underlying antiferromagnetic layer, IrMn layer 75, thereby creating a single magnetic orientation, which does not change. Although NiFe is the preferred material for layer 77, any of a variety of materials, or alloys, with good magnetic properties may be used.

Moreover, although aluminum oxide is the preferred material for the tunnel junction layer, it must be understood that the invention is not limited to such, and other nonmagnetic materials, such as copper (Cu), titanium oxide ($TiO_2$), magnesium oxide (MgO), or aluminum nitride (AlN), for example, may also be used. In the case where the tunnel junction layer 80 is formed of aluminum oxide, this layer can be formed by depositing an aluminum film over the second NiFe layer 77, and then oxidizing the aluminum film by an oxidation source, such as RF oxygen plasma.

In this exemplary embodiment, the IrMn layer 75 is deposited to a thickness of about 10–100 Angstroms, and more preferably of about 60 Angstroms. Similarly, the second NiFe layer 77 is deposited to a thickness of about 10–100 Angstroms, more preferably of about 40 Angstroms, while the tunnel junction layer 80 is deposited to a thickness of about 5–25 Angstroms, and more preferably of about 15 Angstroms.

Deposition of the layers 75, 77 and 80 may be accomplished by any method known in the art, including, but not limited to vacuum evaporation, sputtering, CVD, PECVD, or low pressure chemical vapor deposition (LPCVD). Preferably, however, the vacuum condition is held during deposition at tie critical interfaces between the IrMn layer 75 and the second NiFe layer 77, and also between the NiFe layer 77 and the tunnel junction layer 80. For the deposition of most other layers, on the other hand, such special processing is not necessary, wherein standard pre-deposition sequences, such as sputtering (e.g. physical ablation using argon plasma) or chemical pre-clean procedures may be acceptably performed in connection with the standard processing.

Figure 18:
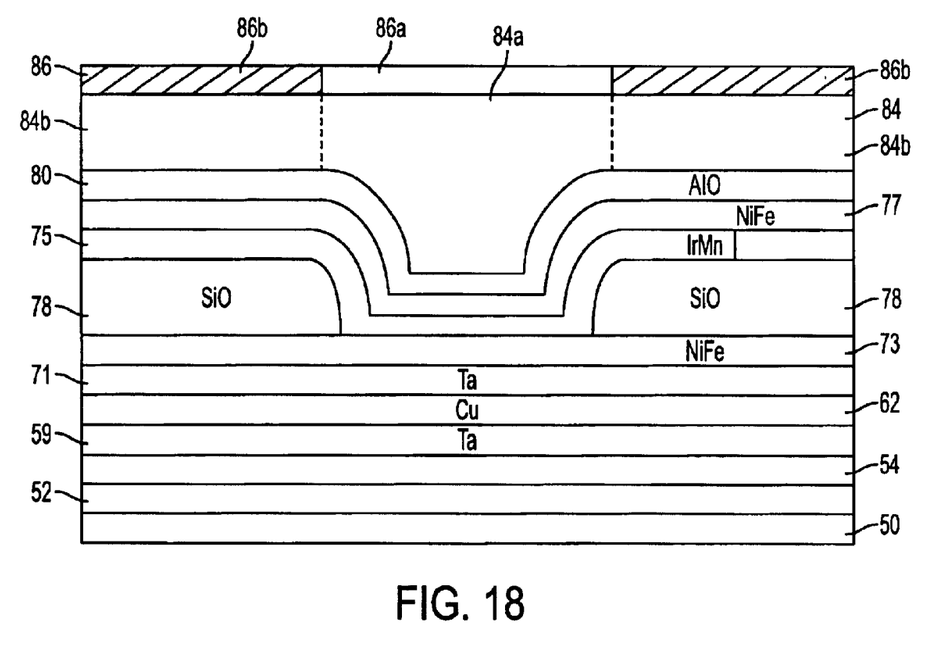
FIG. 18 illustrates a partial cross-sectional view of the MRAM structure at a stage of processing subsequent to that shown in FIG. 17.

Following the deposition of the layers 75, 77 and 80, a second spacer layer 82 is formed overlying the tunnel junction layer 80 in a manner similar to the formation of the first spacer layer 78. Specifically, as shown in FIG. 18, a positive silicon-containing photoresist layer 84 is deposited over the tunnel junction layer 80, and a dark field mask 86 is positioned over the photoresist layer 84, with opaque portions 86b of mask 86 covering resist portions 84b, and clear portion 86a of mask 86 over resist portion 84a to be removed. The photoresist 84 is exposed through the mask 86, and the resist portion 84a is developed and removed.

Figure 19:
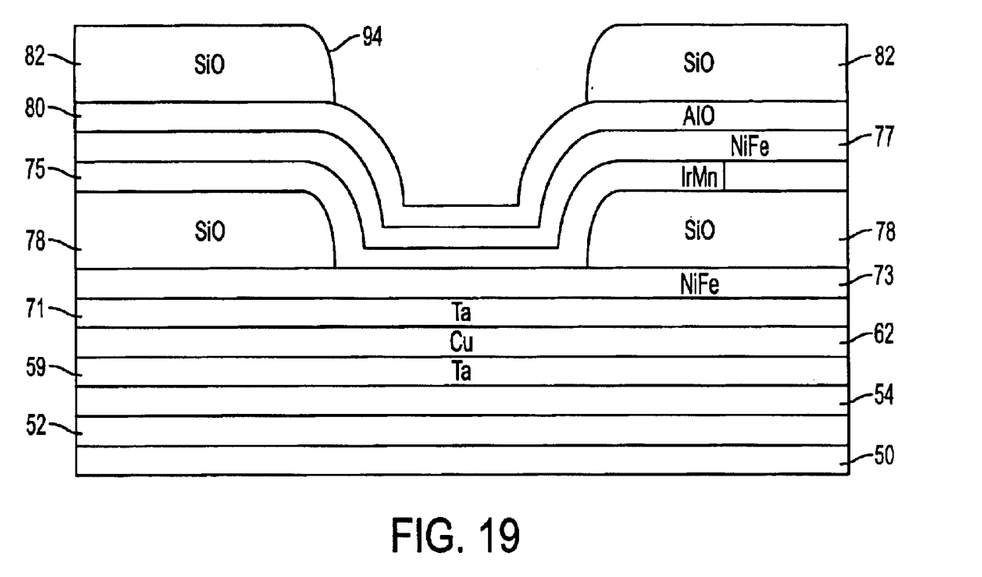
FIG. 19 illustrates a partial cross-sectional view of the MRAM structure at a stage of processing subsequent to that shown in FIG. 18.

The remaining portions 84b of photoresist layer 84 are then converted to the SiO spacer layer 82 seen in FIG. 19 by heating at a relatively low temperature (e.g., about 100° C.) in an oxygen-rich plasma environment. As was the case with the spacer layer 78 shown in FIG. 16, upper edges 94 of spacer layer 82 may be rounded by spacing the mask 86 slightly away from the photoresist layer 84 during exposure, or by chemical etching or by mechanical means either before or after conversion to the SiO film.

Figure 20:
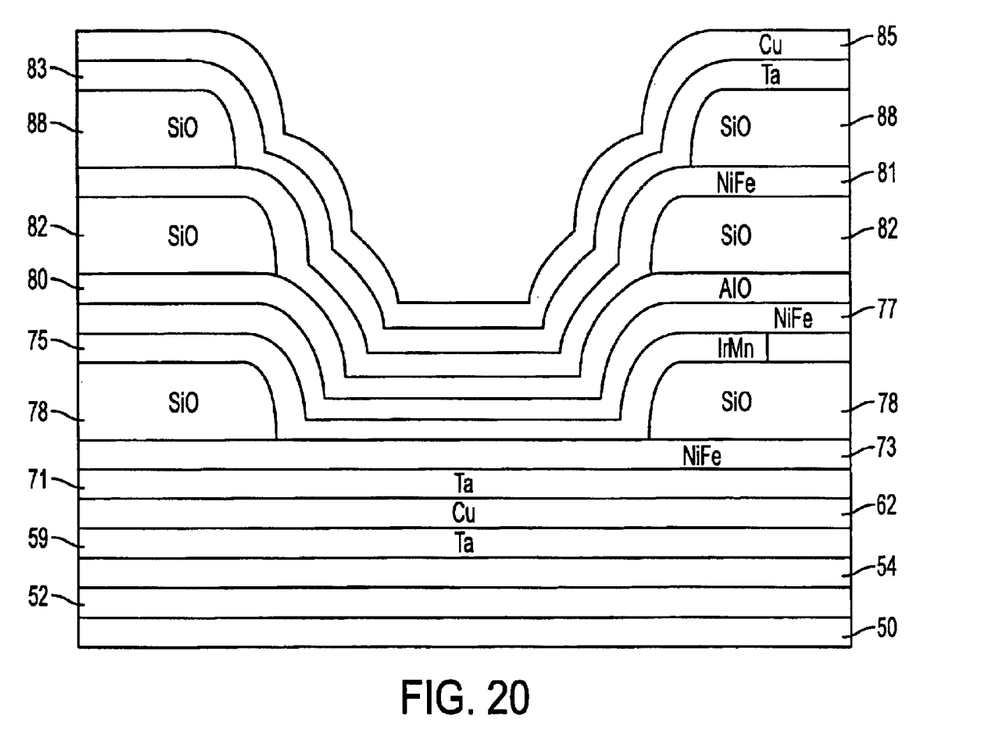
FIG. 20 illustrates a cross-sectional view of a complete MRAM post-deposition and pre-etch stack in accordance with the present invention.

Referring now to FIG. 20, a third nickel-iron (NiFe) layer 81 is blanket deposited over the second spacer layer 82 and the tunnel junction layer 80. In the region between the respective portions of the corresponding spacer layer 78, 82, third NiFe layer 81 is deposited directly on the tunnel junction layer 80, and on the second spacer layer 82 at the peripheral regions seen in the figure. Preferably, third NiFe layer 81 is deposited to a thickness of about 10–100 Angstroms, and more preferably about 40 Angstroms.

A third spacer layer 88 is formed of SiO on the peripheral regions of the third NiFe layer 81 in the same manner described above for spacer layers 78 and 82. After formation of the third spacer layer 88, a second tantalum (Ta) layer 83 and a conductive layer 85 are successively blanket deposited over the third spacer layer 88 and the third NiFe layer 81 as shown in FIG. 20. The third NiFe layer 81 serves as the sense magnetic element, which has a magnetic orientation that is free to switch between two states in response to applied magnetic fields. The second Ta layer 83 serves as a barrier to prevent migration of the conductive layer 85 from migrating into the NiFe layer 81 of the MRAM stack.

Preferably, the second Ta layer 83 is deposited to a thickness of about 10–200 Angstroms, and more preferably about 100 Angstroms. Similarly, the conductive layer 85 is deposited to a thickness of about 100–400 Angstroms, and more preferably about 200–300 Angstroms. Deposition of the layers 81, 83 and 85 may be accomplished by magnetron sputtering, for example, but other conventional deposition methods may alternatively be used, such as vacuum evaporation, CVD, PECVD, or other types of sputtering techniques, for example, depending on the characteristics of the integrated circuit devices to be used in conjunction with the MRAM cells of the present invention.

Like conductive layer 62, conductive layer 85 forms an interconnect line between the MRAM cell and the CMOS transistors fabricated in underlying layer 52, which operatively control the MRAM cell. In the exemplary embodiment of the invention disclosed herein, the conductive layer 85 may be formed of copper (Cu). However, the invention is not limited in this regard, as the conductive layer 85 may alternatively be comprised of a more resistive material such as tungsten nitrogen (WN), TaN, WSiN, and others.

Figure 21:
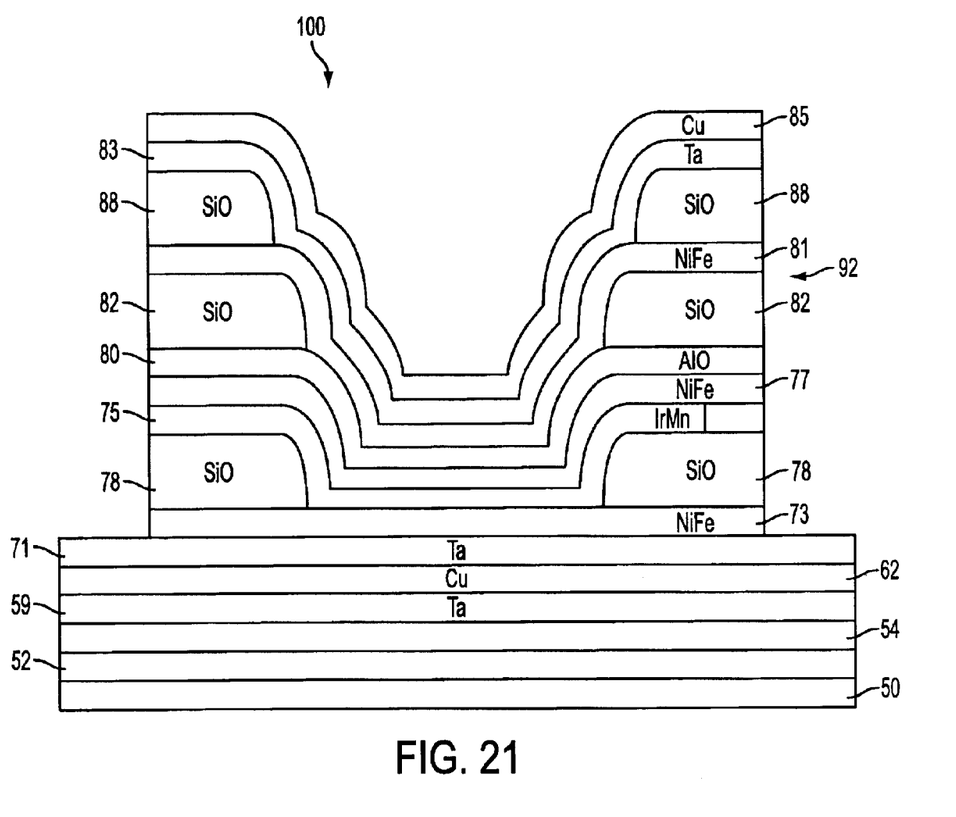
FIG. 21 illustrates a cross-sectional view of a post-etched MRAM stack in accordance with the present invention.

When all the layers of the MRAM cell stack have been deposited, the stack is dry etched around the periphery of each MRM cell, to thereby define each individual MRAM cell 100 as shown in FIG. 21. The physical separation between the conductive layers 73 and 75, 80 and 81, and 81 and 83 achieved by the respective insulator spacet layers 78, 82 and 88 each produced from a converted photoresist layer provides several advantages over prior art MRAM structures and fabrication methods.

Among the most significant of the undesirable effects which are ameliorated by the present invention is the creation of a conductive path between the different metallic layers along the side wall 92 of the MRAM cell formed by an accumulation of particulate etch residue generated during the final etching process. In the prior art, even cleaning the side walls of the MRAM stacks with wet chemicals after the dry etch step, for example, was problematic due to the similarity between the materials forming the conductive path and the layers in the MRAM cell.

With the present invention, even upon the generation of a significant amount of dry etch residue, the conductive layers 73 and 75, 80 and 81, and 81 and 83, respectively, are spaced far enough apart that both wet or dry post-etch cleans should be able to remove enough of the residue to alleviate the unwanted cross layer interaction. Thus, shorting across the aluminum oxide layer 80, which is the most critical, is prevented.

Another advantage of the present invention is that by converting a silicon-containing photoresist layer into an SiO layer in the presence of an oxygen rich plasma, SiO film can be deposited at a much lower temperature (e.g., about 100° C.) than otherwise achievable (e.g., about 450° C.) if deposited via any other deposition method. Also, the inventive method disclosed herein is more efficient than the prior art in that it is not necessary to dry or wet etch the MRAM stack after exposure of the resist through the mask. In other words, by obtaining the SiO layer directly from a photoresist layer, the desired pattern is achieved merely by developing the photoresist layer after exposure, without requiring a separate etch processing along with its associated disadvantages mentioned above.

Formation of the spacer layers 78, 82 and 88 is not limited to a process of applying a positive photoresist, exposing and developing the resist, and converting the resist to SiO in an oxygen-rich plasma, as described above. Alternatively, the SiO can be deposited by more traditional deposition methods, such as by chemical vapor deposition, plasma vapor deposition, vacuum evaporation, or other known methods. When the SiO layer is blanket deposited according to one of the known methods, the recessed region 98 (FIG. 16) is formed for each SiO layer by traditional methods of applying a photoresist, exposing the photoresist through a mask and subsequently developing the photoresist, etching the SiO layer in accordance with the developed photoresist, and removing the photoresist.

The present invention is not limited to the specific MRAM stack structure discussed hereinabove. In particular, although the MRAM stack as described herein as having the sense magnetic layer formed over the pinned magnetic layer, the present invention also encompasses an MRAM stack formed in which the pinned magnetic layer is formed over the sense layer. Also, the isolation of critical layers can be used in any edge sensitive thin film stack to minimize the effects of patterning. A PCRAM structure is but one other example in which the present invention may be used. There are many variations and stack organization strategies in which the present invention may be employed, wherein the layer isolation technique can be performed to isolate individual layers or groups of layers.

Although the spacer layers described herein are preferably composed of a silicon oxide (SiO) material, e.g., silicon dioxide ($SiO_2$), the spacer layers according to the present invention are not restricted to being formed of an SiO material. For example, the material of the spacer layers can alternatively be composed of silicon nitride ($Si_3N_4$) material or silicon, carbide (SiC). Moreover, the insulator material forming the spacer layers may optionally be a dielectric material if desired, depending on the structure and function of the multilayer film stack.

Care should be taken when converting the photoresist layer to the SiO (or SiN or SiC) layer so as to not adversely affect sensitive thin layers in the stack. In the embodiment described herein, for example, the spacer layer 82 is shown if FIGS. 18–20 as being located between the tunnel junction layer 80 and the third NiFe layer 81. Contrary to this arrangement, the spacer layer 82 should not be arranged between the second NiFe layer 77 and the tunnel junction layer 80, because the lower NiFe layer 77 may become oxidized, whereupon the magnetic properties of the film would be ruined.

Figure 22:
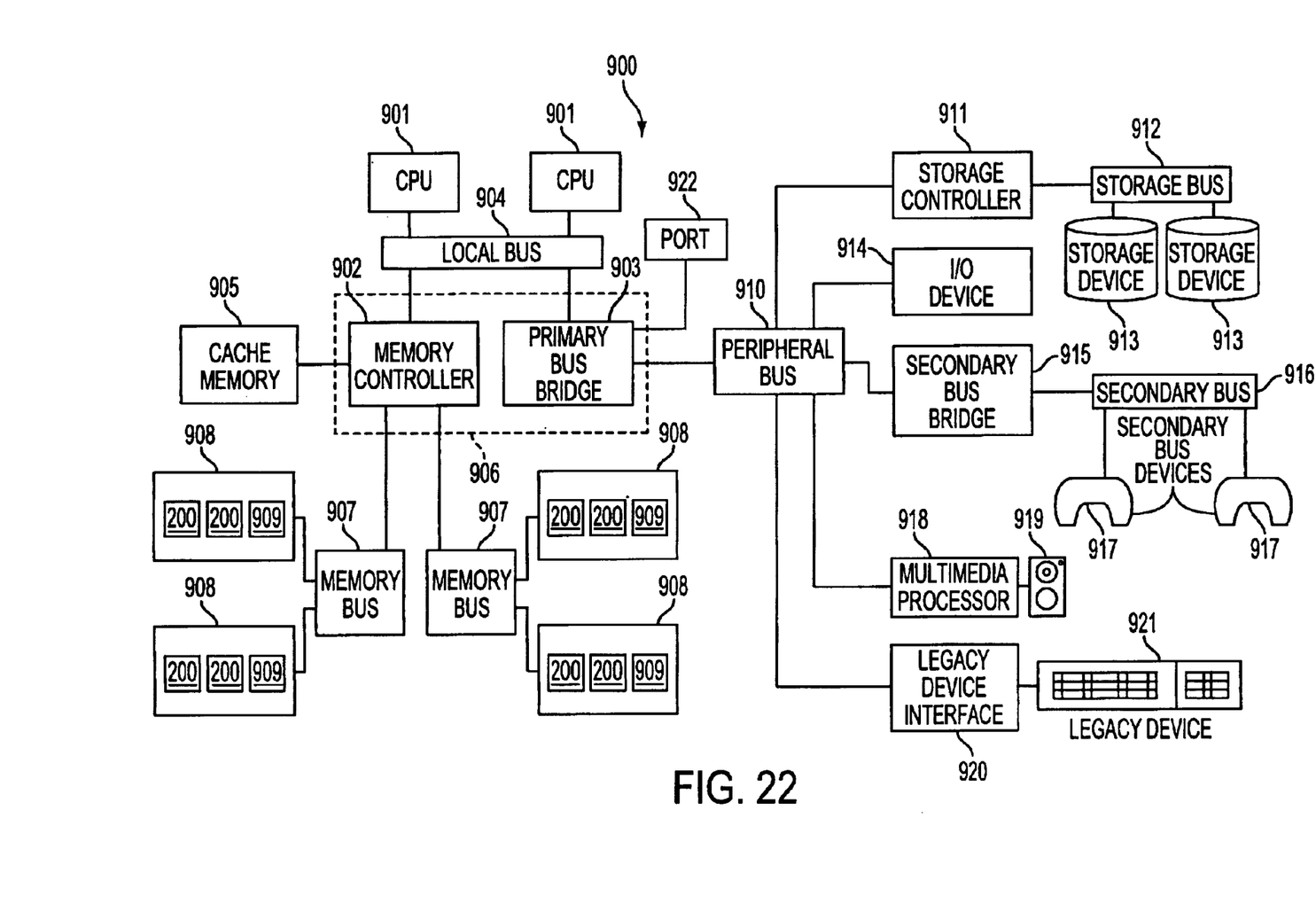
FIG. 22 is a schematic diagram of a processor system incorporating an MRAM constructed in accordance with the present invention.

FIG. 22 illustrates an exemplary processing system 900 which may utilize the MRAM memory device 200 having a plurality of memory cells 100 constructed in accordance with the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one MRAM cell 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 22 is only an exemplary processing system with which the invention may be used. While FIG. 22 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Although the present invention has been described in relation to particular embodiments thereof, many other variations and modifications and other uses will become apparent to those skilled in the art. Therefore, the present invention is to be limited not by the specific disclosure herein, but only by the appended claims.

What is claimed as new and desired to be protected by Letters Patent of the United States is:

1. A method of fabricating an MRAM cell, comprising:
   forming a first magnetic element having an interior region peripheral region over a substrate;
   depositing a tunnel junction over the first magnetic element, the tunnel junction layer having an interior region and a peripheral region aligned with the interior region and the peripheral region of the first magnetic element;
   forming a spacer layer over the peripheral region of the tunnel junction layer; and
   forming a second magnetic element over the spacer element and the interior region of the tunnel junction layer, so that the first magnetic element the tunnel junction layer and the second magnetic element all comprise layers of the MRAM cell.

2. The method according to claim 1, wherein forming the spacer layer comprises:
   depositing a resist layer on the tunnel junction layer;
   placing a patterning mask over the resist layer;
   exposing the resist layer covered with the mask;
   developing the resist layer to thereby remove portions of the resist layer; and
   converting the remaining portions of the resist layer into a stable insulator film.

3. The method according to claim 2, wherein converting the remaining portions of the resist layer includes heating the remaining portions of the resist layer in the presence of an oxygen-rich plasma.

4. The method according to claim 3, wherein the remaining portions of the resist layer is heated at a temperature of approximately 100° C.

5. The method according to claim 1, wherein forming the spacer layer comprises:
   blanket depositing a layer of an insulator material;
   depositing a resist layer on the layer of insulator material;
   providing a mask over the resist layer;
   exposing the mask;
   removing the mask;
   developing the resist layer to thereby remove portions of the resist layer;
   etching the layer of insulator material according to the developed mask; and
   removing the resist layer.

6. The method according to claim 1, wherein the first magnetic element is a pinned magnetic element and the second magnetic element is a sense magnetic layer.

7. The method according to claim 6, wherein forming the pinned magnetic element comprises:
   forming a first magnetic layer having an interior region and a peripheral region;
   forming an antiferromagnetic layer having an interior region and a peripheral region aligned over the interior region and the peripheral region of the first magnetic layer;
   forming a second magnetic layer having an interior region and a peripheral region aligned over the interior region and the peripheral region of the magnetic layer and the antiferromagnetic layer; and
   forming a second spacer layer between the peripheral region of the antiferromagnetic layer and the peripheral region of one of the first magnetic layer and the second magnetic layer.

8. The method according to claim 7, wherein forming at least one of the first and second spacer layers comprises:
   depositing a resist layer on the tunnel junction layer;
   placing a patterning make over the resist layer;
   exposing the resist layer covered with the mask;
   developing the resist layer to thereby remove portions of the resist layer; and
   converting the remaining portions of the resist layer into a stable insulator film.

9. The method according to claim 8, wherein converting the remaining portions of the resist layer includes heating the remaining portions of the resist layer in the presence of an oxygen-rich plasma.

10. The method according to claim 9, wherein the remaining portions of the resist layer is heated at a temperature of approximately 100° C.

11. The method according to claim 7, wherein forming at least one of the first and second spacer layers comprises:
    blanket depositing a layer of an insulator material;
    depositing a resist layer on the layer of insulator material;
    providing a mask over the resist layer;
    exposing the mask;
    removing the mask;
    developing the resist layer to thereby remove portions of the resist layer;
    etching the layer of insulator material according to the developed mask; and
    removing the resist layer.

12. The method according to claim 1, wherein the first magnetic element is a sense magnetic layer and the second magnetic element is a pinned magnetic element.

13. The method according to claim 12, wherein forming the pinned magnetic element comprises:
   forming a first magnetic layer having an interior region and a peripheral region;
   forming an antiferromagnetic layer having an interior region and a peripheral region aligned over the interior region and the peripheral region of the fist magnetic layer;
   forming a second magnetic layer having an interior region and a peripheral region aligned over the interior region and the peripheral region of the first magnetic layer and the antiferromagnetic layer; and
   forming a second spacer layer between the peripheral region of the antiferromagnetic layer and the peripheral region of one of the first magnetic layer and the second magnetic layer.

14. The method according to claim 13, wherein forming at least one of the first and second spacer layers comprises:
   depositing a resist layer on the tunnel junction layer;
   placing a patterning mask over the resist layer;
   exposing the resist layer covered with the mask;
   developing the resist layer to thereby remove portions of the resist layer; and
   converting the remaining portions of the resist layer into a stable insulator film.

15. The method according to claim 14, wherein converting the remaining portions of the resist layer includes heating the remaining portions of the resist layer in the presence of an oxygen-rich plasma.

16. The method according to claim 15, wherein the remaining portions of the resist layer is heated to a temperature of approximately 100° C.

17. The method according to claim 13, wherein forming at least one of the first and second spacer layers comprises:
   blanket depositing a layer of an insulator material;
   depositing a resist layer on the layer of insulator material;
   providing a mask over the resist layer;
   exposing the mask;
   removing the mask;
   developing the resist layer to thereby remove portions of the resist layer;
   etching the layer of insulator material according to the developed mask; and
   removing the resist layer.

18. The method according to claim 1, further comprising:
   forming a conductive layer having an interior region and a peripheral region aligned with the interior regions and the peripheral regions of the first and second magnetic elements, wherein the interior region of the conductive layer is adjacent to the interior region of one of the first and second magnetic elements;
   forming a second spacer layer between the peripheral region of the conductive layer and the peripheral region of the adjacent first or second magnetic element.

19. The method according to claim 18, wherein forming at least one of the first and second spacer layers includes
   depositing a resist layer on the tunnel junction layer;
   placing a patterning mask over the resist layer;
   exposing the resist layer covered with the mask;
   developing the resist layer to thereby remove portions of the resist layer; and
   converting the remaining portions of the resist layer into a stable insulator film.

20. The method according to claim 19, wherein converting the remaining portions of the resist layer includes the remaining portions of the resist layer in the presence of an oxygen-rich plasma.

21. The method according to claim 20, wherein the remaining portions of the resist layer is heated to a temperature of approximately 100° C.

22. The method according to claim 18, wherein forming at least one of the first and second spacer layers comprises:
   blanket depositing a layer of an insulator material;
   depositing a resist layer on the layer of insulator material;
   providing a mask over the resist layer;
   exposing the mask;
   removing the mask;
   developing the resist layer to thereby remove portions of the resist layer;
   etching the layer of insulator material according to the developed mask; and
   removing the resist layer.

23. A method of fabricating a multilayer memory cell stack, comprising:
   forming a first conductive layer having a circumferential edge region over a substrate;
   forming a spacer layer made of insulator material over the circumferential edge region of the first conductive layer; and
   forming a second conductive layer over the first conductive layer and having a circumferential edge region positioned over the spacer layer, wherein the first conductive layer and the second conductive layer are both layers of the memory cell.

24. The method according to claim 23, wherein forming the spacer layer comprises:
   depositing a resist layer over the first conductive layer;
   placing a patterning mask over the resist layer;
   exposing the resist layer covered with the mask;
   developing the resist layer to thereby remove portions of the resist layer; and
   converting the remaining portions of the resist layer into a stable insulator film.

25. The method according to claim 24, wherein converting the remaining portions of the resist layer includes heating the remaining portions of the resist layer in the presence of an oxygen-rich plasma.

26. The method according to claim 25, wherein the remaining portions of the resist layer is heated at a temperature of approximately 100° C.

27. The method according to claim 23, wherein forming the spacer layer comprises:
   blanket depositing a layer of an insulator material;
   depositing a resist layer on the layer of insulator material;
   providing a mask over the resist layer;
   exposing the mask;
   removing the mask;
   developing the resist layer to thereby remove portions of the resist layer;
   etching the layer of insulator material according to the developed mask; and
   removing the resist layer.

* * * * *

UNITED STATES PATENT AND TRADEMARK OFFICE
CERTIFICATE OF CORRECTION

PATENT NO. : 6,737,283 B2
DATED : May 18, 2004
INVENTOR(S) : Paul A. Morgan

It is certified that error appears in the above-identified patent and that said Letters Patent is hereby corrected as shown below:

Column 8,
Line 64, "MRM" is replaced with -- MRAM. --
Line 67, "spacet" is replaced with -- spacer. --

Column 14,
Line 4, "includes the" is replaced with -- includes heating the. --

Signed and Sealed this

Seventh Day of December, 2004

JON W. DUDAS
*Director of the United States Patent and Trademark Office*